(12) United States Patent
Onishi et al.

(10) Patent No.: US 7,326,965 B2
(45) Date of Patent: Feb. 5, 2008

(54) SURFACE-EMITTING TYPE DEVICE AND ITS MANUFACTURING METHOD

(75) Inventors: Hajime Onishi, Chino (JP); Tetsuo Nishida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 40 days.

(21) Appl. No.: 11/344,192

(22) Filed: Feb. 1, 2006

(65) Prior Publication Data
US 2006/0208655 A1    Sep. 21, 2006

(30) Foreign Application Priority Data
Mar. 18, 2005    (JP) .............................. 2005-079184

(51) Int. Cl.
*H01L 27/15* (2006.01)
(52) U.S. Cl. .......................... 257/79; 257/257; 257/84; 257/85; 257/112; 257/119; 257/163; 257/168; 257/431; 257/E25.002; 257/E21.358
(58) Field of Classification Search .................. 257/84, 257/85, 96, 97, 119, E25.002, E21.358, 79, 257/112, 163, 168, 176, 257, 322, 431–433, 257/487, 591
See application file for complete search history.

(56) References Cited

U.S. PATENT DOCUMENTS

| | | | | |
|---|---|---|---|---|
| 4,212,020 | A * | 7/1980 | Yariv et al. | 372/50.1 |
| 5,404,373 | A * | 4/1995 | Cheng | 372/50.124 |
| 6,690,028 | B2 * | 2/2004 | Wakimoto et al. | 257/40 |
| 6,720,583 | B2 * | 4/2004 | Nunoue et al. | 257/98 |
| 6,777,805 | B2 * | 8/2004 | Uemura et al. | 257/745 |

FOREIGN PATENT DOCUMENTS

| | | |
|---|---|---|
| JP | 05-226778 | 9/1993 |
| JP | A 05-234888 | 9/1993 |
| JP | A 06-021508 | 1/1994 |
| JP | A 06-069129 | 3/1994 |

(Continued)

*Primary Examiner*—Jasmine Clark
(74) *Attorney, Agent, or Firm*—Oliff & Berridge, PLC

(57) ABSTRACT

A surface-emitting type device includes a substrate including a first face, a second face that is tilted with respect to the first face and has a plane index different from a plane index of the first face, and a third face that is tilted with respect to the second face and has a plane index equal to the plane index of the first face, an emission section formed above the first face, and a rectification section formed above each of the second face and the third face, wherein the emission section includes a first semiconductor layer of a first conductivity type, an active layer formed above the first semiconductor layer, and a second semiconductor layer of a second conductivity type formed above the active layer, the rectification section includes a first semiconductor layer of the second conductivity type formed above the second face, and a second semiconductor layer of the first conductivity type formed continuously with the first semiconductor layer above the third face, at least a portion of the first semiconductor layer of the emission section, the first semiconductor layer of the rectification section, and the second semiconductor layer of the rectification section are formed by a common process and include the same impurity, the emission section and the rectification section are electrically connected in parallel with each other, and the rectification section has a rectification action in a reverse direction with respect to the emission section.

10 Claims, 9 Drawing Sheets

FOREIGN PATENT DOCUMENTS

| | | |
|---|---|---|
| JP | A 06-069520 | 3/1994 |
| JP | A 06-097564 | 4/1994 |
| JP | A 08-264558 | 10/1996 |
| JP | A 10-308559 | 11/1998 |
| JP | A 2004-006548 | 1/2004 |

* cited by examiner

SURFACE-EMITTING TYPE DEVICE AND ITS MANUFACTURING METHOD

The entire disclosure of Japanese Patent Application No. 2005-079184, filed Mar. 18, 2005 is expressly incorporated by reference herein.

BACKGROUND

1. Technical Field

The present invention relates to surface-emitting type devices and methods for manufacturing the same.

2. Related Art

A surface-emitting type semiconductor laser has a smaller device volume compared to an edge-emitting type semiconductor laser, such that the electrostatic breakdown voltage of the device itself is low. For this reason, the device may be damaged by static electricity caused by a machine or an operator in a mounting process. In particular, a surface-emitting type device such as a surface-emitting type semiconductor laser has a certain tolerance to a voltage in a forward direction, but has a low tolerance to a voltage in a reverse direction, and the device may be destroyed when a voltage in a reverse direction is impressed. A variety of measures are usually implemented in a mounting process to remove static electricity, but these measures have limitations.

With respect to edge-emitting type semiconductor lasers, for example, Japanese Laid-open patent application JP-A-2004-6548 describes a technology in which a laser diode is connected in parallel with a capacitance element to improve the electrostatic breakdown voltage.

SUMMARY

In accordance with an advantage of some aspects of the invention, electrostatic destruction can be prevented and reliability can be improved with respect to surface-emitting type devices and methods for manufacturing the same.

In accordance with an embodiment of the invention, a surface-emitting type device includes a substrate including a first face, a second face that is tilted with respect to the first face and has a plane index different from a plane index of the first face, and a third face that is tilted with respect to the second face and has a plane index that is the same as the plane index of the first face, an emission section formed above the first face, and a rectification section formed above the second face and the third face, wherein the emission section includes a first semiconductor layer of a first conductivity type, an active layer formed above the first semiconductor layer, and a second semiconductor layer of a second conductivity type formed above the active layer, the rectification section includes a first semiconductor layer of the second conductivity type formed above the second face, and a second semiconductor layer of the first conductivity type formed continuously with the first semiconductor layer above the third face, at least a portion of the first semiconductor layer of the emission section, the first semiconductor layer of the rectification section, and the second semiconductor layer of the rectification section are formed by a common process and include the same impurity, the emission section and the rectification section are electrically connected in parallel with each other, and the rectification section has a rectification action in a reverse direction with respect to the emission section.

According to the surface-emitting type device, even when a voltage in a reverse direction is impressed to the emission section, a current flows in the rectification section that is connected in parallel with the emission section. By this, the electrostatic breakdown voltage of the surface-emitting type device to a reverse direction voltage can be considerably improved. Accordingly, destruction of the device by static electricity in a mounting process or the like can be prevented, such that its handling can be well facilitated, and its reliability can be improved.

It is noted that, in the embodiments of the invention, another specific element (hereafter referred to as "B") that is formed above a specific element (hereafter referred to as "A"), includes B that is formed directly on A, and B that is formed above A through another element on A. Also, in the invention, the statement "forming B above A" includes a case of forming B directly on A, and a case of forming B above A through another element on A.

Also, in accordance with the invention, A plane (for example, (111) A-plane of GaAs) and B plane (for example, (111) B-plane of GaAs) have different plane indices.

In the surface-emitting type device in accordance with an aspect of the embodiment, an upper surface of the first semiconductor layer of the emission section, an upper surface of the active layer of the emission section and an upper surface of the second semiconductor layer of the emission section may be in parallel with the first face, an upper surface of the first semiconductor layer of the rectification section may be in parallel with the second face, and an upper surface of the second semiconductor layer of the rectification section may be in parallel with the third face.

In the surface-emitting type device in accordance with an aspect of the embodiment, the first face and the third face may have a plane index that is the same as a plane index of the substrate.

In the surface-emitting type device in accordance with an aspect of the embodiment, the impurity may be silicon, and the first semiconductor layer of the emission section, the first semiconductor layer of the rectification section and the second semiconductor layer of the rectification section may include at least one of a GaAs layer and an AlGaAs layer.

The surface-emitting type device in accordance with an aspect of the embodiment may include a first electrode that is electrically connected to the first semiconductor layer of the emission section, a second electrode that is electrically connected to the second semiconductor layer of the emission section, a third electrode that is electrically connected to the first semiconductor layer of the rectification section, and a fourth electrode that is electrically connected to the second semiconductor layer of the rectification section, wherein the first electrode and the third electrode may be electrically connected with each other, and the second electrode and the fourth electrode may be electrically connected with each other.

In the surface-emitting type device in accordance with an aspect of the embodiment, an upper surface of the emission section may be present on an extended plane of an upper surface of the second semiconductor layer of the rectification section.

In the surface-emitting type device in accordance with an aspect of the embodiment, the emission section may function as a surface-emitting type semiconductor laser, and the first semiconductor layer of the emission section and the second semiconductor layer of the emission section may be mirrors.

A method for manufacturing a surface-emitting type device in accordance with an embodiment of the invention includes the steps of:

forming a second face that is tilted with respect to a first face of a substrate and has a plane index different from a plane index of the first face, and forming a third face that is tilted with respect to the second face and has a plane index that is the same as the plane index of the first face, and forming an emission section above the first face and a rectification section above the second face and the third face, wherein the step of forming the emission section and the rectification section includes the steps of forming, above the substrate, a first layer that becomes to be at least a first semiconductor layer of the emission section, a first semiconductor layer of the rectification section, and a second semiconductor layer of the rectification section by adding an impurity to make the first semiconductor layer of the emission section and the second semiconductor layer of the rectification section to be a first conductivity type, and the first semiconductor layer of the rectification section to be a second conductivity type, forming, above the first layer, a second layer that becomes to be at least an active layer of the emission section, forming, above the second layer, a third layer that becomes to be at least a second semiconductor layer of the emission section, adding a second conductivity type impurity in the second semiconductor layer of the emission section, and forming the first semiconductor layer of the emission section, the active layer of the emission section and the second semiconductor layer of the emission section above the first face, the first semiconductor layer of the rectification section above the second face, and the second semiconductor layer of the rectification section above the third face by patterning the first layer, the second layer and the third layer, wherein the emission section and the rectification section are arranged to be electrically connected in parallel with each other, and the rectification section has a rectification action in a reverse direction with respect to the emission section.

In the method for manufacturing a surface-emitting type device in accordance with an aspect of the embodiment, the first semiconductor layer of the emission section, the first semiconductor layer of the rectification section and the second semiconductor layer of the rectification section may be formed by a molecular beam epitaxy method.

DESCRIPTION OF EXEMPLARY EMBODIMENTS

Preferred embodiments of the invention are described below with reference to the accompanying drawings.

1. First, a surface-emitting type device 100 in accordance with an embodiment is described.

Figure 1:
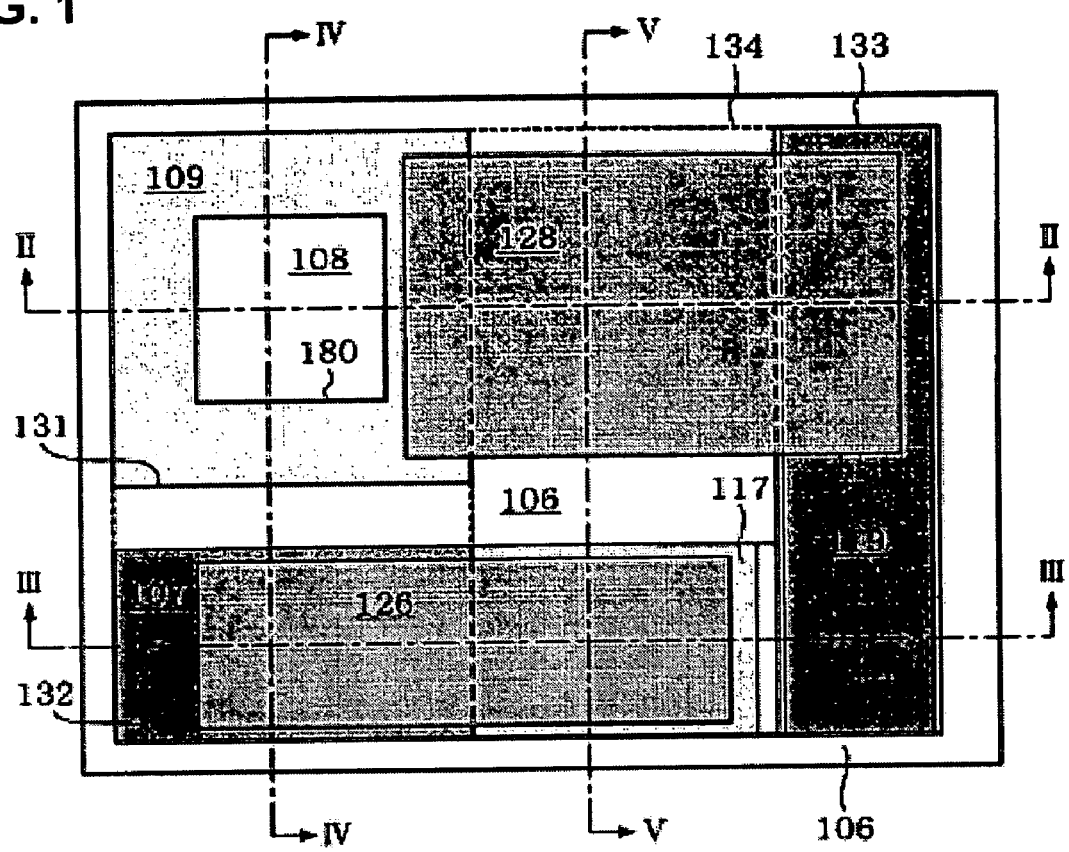
FIG. 1 is a plan view schematically showing a surface-emitting type device in accordance with an embodiment of the invention.
Figure 2:
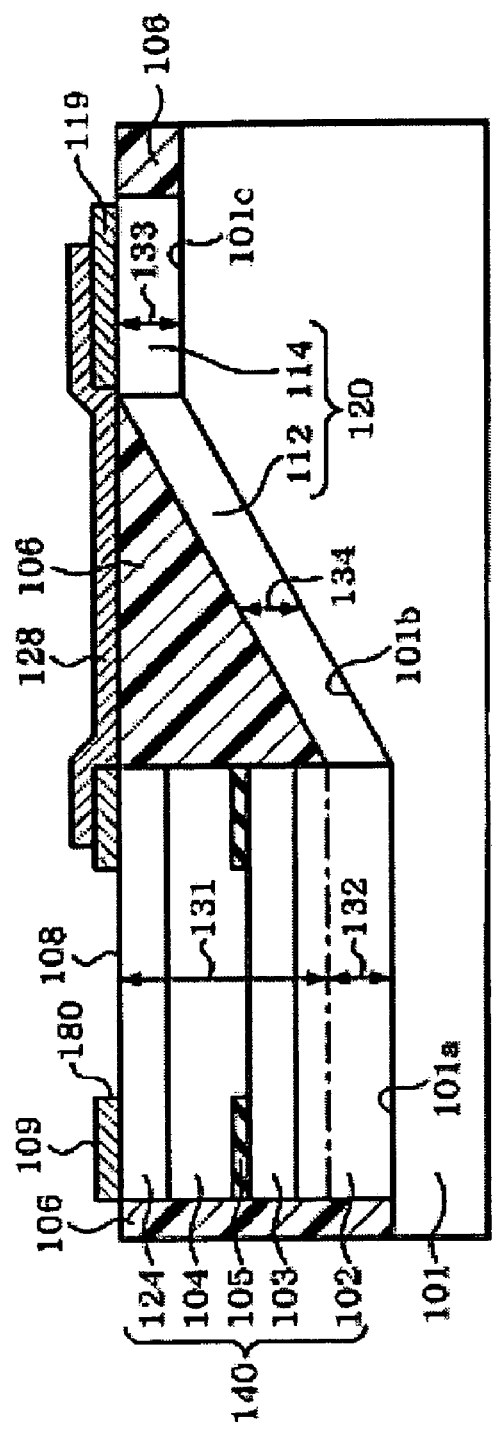
FIG. 2 is a cross-sectional view schematically showing the surface-emitting type device in accordance with the embodiment.
Figure 3:
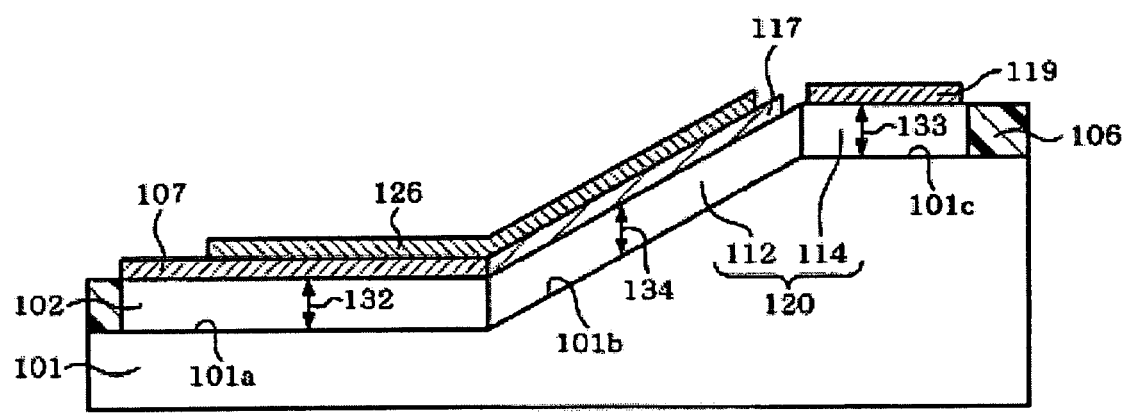
FIG. 3 is a cross-sectional view schematically showing the surface-emitting type device in accordance with the embodiment.
Figure 4:
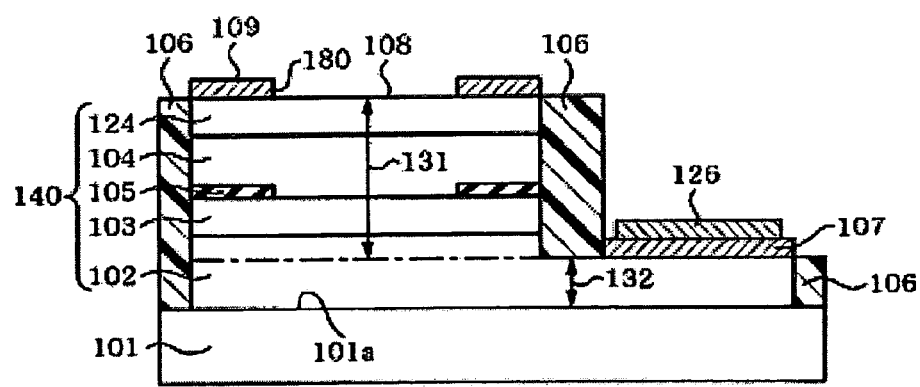
FIG. 4 is a cross-sectional view schematically showing the surface-emitting type device in accordance with the embodiment.
Figure 5:
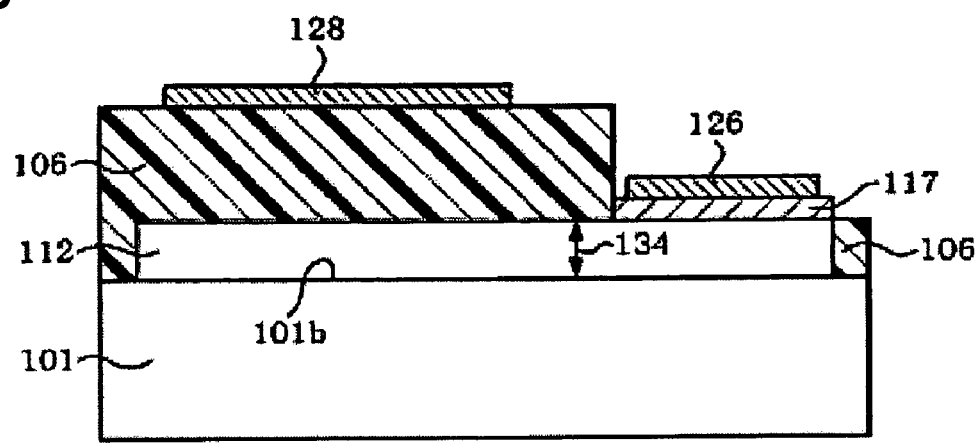
FIG. 5 is a cross-sectional view schematically showing the surface-emitting type device in accordance with the embodiment.
Figure 6:
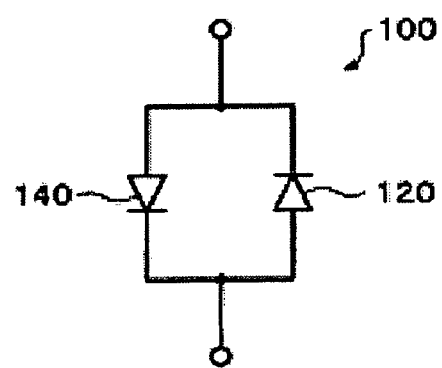
FIG. 6 is a circuit diagram of the surface-emitting type device in accordance with the embodiment.

FIG. 1 is a plan view schematically showing the surface-emitting type device 100, FIG. 2 is a cross-sectional view taken along a line II-II of FIG. 1, FIG. 3 is a cross-sectional view taken along a line III-III of FIG. 1, FIG. 4 is a cross-sectional view taken along a line IV-IV of FIG. 1, FIG. 5 is a cross-sectional view taken along a line V-V of FIG. 1, and FIG. 6 is a circuit diagram of the surface-emitting type device 100.

The surface-emitting type device 100 includes, as shown in FIG. 2, FIG. 3 and FIG. 4, a substrate 101, an emission section 140 and a rectification section 120. The present embodiment is described as to a case where the emission section 140 functions as a surface-emitting type semiconductor laser, and the rectification section 120 functions as a junction diode.

The substrate 101 supports the emission section 140 and the rectification section 120. In other words, the emission section 140 and the rectification section 120 are formed in a common substrate (a common chip), and forms a monolithic structure. An upper surface of the substrate 101 includes a first face 101a, a second face 101b and a third face 101c, as shown in FIG. 2 and FIG. 3. The first face 101a, the second face 101b and the third face 101c are continuous in this order. The second face 101b is tilted with respect to the first face 101a and the third face 101c. In other words, the second face 101b is formed between the first face 101a and the third face 101c, and a step is formed in the upper surface of the substrate 101. The first face 101*a* is formed at a position lower than the third face 101*c*.

The plane index of the first face 101*a* and the plane index of the third face 101 *c* are the same. In other words, the first face 101 *a* and the third face 101 *c* are in parallel with each other. Also, the first and third faces l0l *a* and 101 *c* can have the same plane index as the plane index of the substrate 101. In other words, more concretely, for example, when a (100) GaAs substrate is used as the substrate 101, the first and third faces 101*a* and 101*c* may have a (100) plane.

The plane index of the first and third faces 101*a* and 101*c* is different from the plane index of the second face 101*b*. Combinations of the plane index of the first and third faces 101*a* and 101*c* and the plane index of the second face 101*b* are not particularly limited, and a variety of combinations is possible, as described below, as long as a first semiconductor layer 102 of the emission section 140 is formed in a first conductivity type, and a first semiconductor layer 112 of the rectification section 120 is formed in a second conductivity type. Combinations of the first and third faces 101*a* and 101*c* and the second face 101*b* may be appropriately selected by referring to relevant document, such as, for example, "Institute of Electrical Engineers of Japan, Document for Electronic Material, EFM-91-17 (1991) 63 by Toshihiko Takebe, et al." For example, as combinations of the first and third faces 101*a* and 101*c* and the second face 101*b*, (100) plane and (311) A-plane, and (411) A-plane and (111) A-plane may be enumerated.

As the substrate 101, for example, a semi-insulating GaAs substrate may preferably be used. Also as the substrate 101, for example, a Si substrate or a conductive GaAs substrate with at least one of a semi-insulating GaAs layer and an AlGaAs layer formed thereon may be used.

The emission section 140 is formed on the first face 101*a* of the substrate 101. The emission section 140 includes a first semiconductor layer 102 of a first conductivity type (n-type), an active layer formed on the first semiconductor layer 102, a second semiconductor layer 104 of a second conductivity type (p-type in the present embodiment) formed on the active layer 103, and a contact layer 124 of the second conductivity type (p-type) formed on the second semiconductor layer 104. An upper surface of the first semiconductor layer 102, an upper surface of the active layer 103 and an upper surface of the second semiconductor layer 104 are in parallel with the first face 101*a*.

The first semiconductor layer 102 is, for example, a distributed Bragg reflection type (DBR) mirror of 40 pairs of alternately laminated n-type $Al_{0.9}Ga_{0.1}As$ layers and n-type $Al_{0.15}Ga_{0.85}As$ layers. The first semiconductor layer 102 includes IV group atoms such as silicon (Si). The active layer 103 has a multiple quantum well (MQW) structure in which quantum well structures each formed from, for example, a GaAs well layer and an $Al_{0.3}Ga_{0.7}As$ barrier layer are laminated in three layers. The second semiconductor layer 104 is, for example, a DBR mirror of 25 pairs of alternately laminated p-type $Al_{0.9}Ga_{0.1}As$ layers and p-type $Al_{0.15} Ga_{0.85}As$ layers. The contact layer 124 is composed of, for example, a p-type GaAs layer. It is noted that the composition of each of the layers and the number of the layers composing the first semiconductor layer 102, the active layer 103 and the second semiconductor layer 104 are not particularly limited. The p-type second semiconductor layer 104, the active layer 103 that is not doped with an impurity and the n-type first semiconductor layer 102 form a pin diode.

A portion of the emission section 140 extending from the contact layer 124 to an intermediate point of the first semiconductor layer 102 composes a columnar semiconductor deposited body (hereafter referred to as a "first columnar section") 131, and the remaining portion of the first semiconductor layer 102 composes another columnar semiconductor deposited body (hereafter referred to as a "second columnar section") 132. The first columnar section 131 has a plane configuration that is, for example, a rectangular shape (including a square shape, and the same applies hereafter) as shown in FIG. 1, but may be, for example, in a circular shape. The second columnar section 132 has a plane configuration that is, for example, a rectangular shape as shown in FIG. 1. The first columnar section 131 is formed above a portion of the second columnar section 132.

The emission section 140 has an oxidized constricting layer 105. The oxidized constricting layer 105 may be, for example, one of the layers composing the second semiconductor layer 104. The oxidized constricting layer 105 is formed in a region near the active layer 103. As the oxidized constricting layer 105, for example, an oxidized AlGaAs layer can be used. The oxidized constricting layer 105 is a dielectric layer having an opening section in its center.

A first electrode 107 is formed on the first semiconductor layer 102. The first electrode 107 has a plane configuration that is, for example, a rectangular shape as shown in FIG. 1. The first electrode 107 is electrically connected to the first semiconductor layer 102. A second electrode 109 is formed on the first columnar section 131. The second electrode 109 has a plane configuration that is, for example, a rectangular shape having an opening section 180 at its center, as shown in FIG. 2. The second electrode 109 is electrically connected to the second semiconductor layer 104 through the contact layer 124. The second electrode 109 has the opening section 180 over the first columnar section 131. In other words, the opening section 180 forms a region in the upper surface of the second semiconductor layer 104 where the second electrode 109 is not provided. This region defines an emission surface 108 of laser light. The shape of the emission surface 108 may be, for example, a rectangular shape as shown in FIG. 2, but may be a circular shape. A current is injected in the active layer 103 by the first electrode 107 and the second electrode 109.

The rectification section 120 includes a first semiconductor layer 112 formed on the second face 101*b* of the substrate 101, and a second semiconductor layer 114 formed on the third face 101*c* of the substrate continuously with the first semiconductor layer 112. The second semiconductor layer 114 of the rectification section 120 is formed at the side of the first semiconductor layer 112, as shown in FIG. 2 and FIG. 3. An upper surface of the emission section 140 (concretely, an upper surface of the contact layer 124 of the emission section 140) is present on an extended plane of the upper surface of the second semiconductor layer 114 of the rectification section 120. In other words, when measured from the back surface of the substrate 101 as a reference, the height of the upper surface of the second semiconductor layer 114 of the rectification section 120 is the same as the height of the upper surface of the emission section 140.

The first semiconductor layer 112 and the second semiconductor layer 114 of the rectification section 120 are formed by a common process conducted to form a part of the first semiconductor layer 102 (the second columnar section 132) of the emission section 140, and include the same impurity. The first semiconductor layer 112 of the rectification section 120 is composed of a semiconductor layer having the same composition and the same film thickness (noted that the film thickness is measured in a direction perpendicular to the back surface of the substrate 101, and the same applies hereafter) as those of the second columnar section 132, and include the same impurity (but, different conductivity types). Also, the second semiconductor layer 114 of the rectification section 120 is composed of a semiconductor layer having the same composition and the same film thickness as those of the second columnar section 132, and includes the same impurity (and the same conductivity).

Concretely, the first semiconductor layer 112 of the rectification section 120 is, for example, a distributed Bragg reflection type (DBR) mirror of 32 pairs of alternately laminated p-type (second conductivity type) $Al_{0.9}Ga_{0.1}As$ layers and p-type $Al_{0.15}Ga_{0.85}As$ layers. The second semiconductor layer 114 of the rectification section 120 is, for example, a distributed Bragg reflection type (DBR) mirror of 32 pairs of alternately laminated n-type (first conductivity type) $Al_{0.9}Ga_{0.1}As$ layers and n-type $Al_{0.15}Ga_{0.85}As$ layers. The first semiconductor layer 112 and the second semiconductor layer 114 of the rectification section 120 include IV group atoms such as silicon (Si), like the first semiconductor layer 102 of the emission section 140.

It is noted that the first semiconductor layer 112 and the second semiconductor layer 114 of the rectification section 120 may be formed by a common process that is conducted for forming the entire first semiconductor layer 102 (in other words, a part of the first columnar section and the second columnar section 132) of the emission section 140. In this case, the film thickness of the first semiconductor layer 112 of the rectification section 120, the film thickness of the second semiconductor layer 114 of the rectification section 120 and the film thickness of the first semiconductor layer 102 of the emission section 140 becomes to be the same with each other.

It is noted that the composition of each of the layers and the number of the layers composing the first semiconductor layer 112 and the second semiconductor layer 114 of the rectification section 120 are not particularly limited. The p-type first semiconductor layer 112 and the n-type second semiconductor layer 114 form a pn diode.

The second semiconductor layer 114 among the rectification section 120 composes a columnar semiconductor deposited body (hereafter referred to as a "third columnar section") 133, and the first semiconductor layer 112 composes another columnar semiconductor deposited body (hereafter referred to as a "fourth columnar section") 134. The third columnar section 133 has a plane configuration that is, for example, a rectangular shape as shown in FIG. 1. The fourth columnar section 134 has a plane configuration that is, for example, a rectangular shape as shown in FIG. 1. The third columnar section 133 is formed continuously with the fourth columnar section 134 at the side of the fourth columnar section 134.

A third electrode 117 is formed on the first semiconductor layer 112. The third electrode 117 has a plane configuration that is, for example, a rectangular shape as shown in FIG. 1. The third electrode 117 is electrically connected to the first semiconductor layer 112. A fourth electrode 119 is formed on the second semiconductor layer 114. The fourth electrode 119 has a plane configuration that is, for example, a rectangular shape as shown in FIG. 1. The fourth electrode 119 is electrically connected to the second semiconductor layer 114. The third electrode 117 and the fourth electrode 119 are used to drive the rectification section 120.

Side surfaces of the first through fourth columnar sections 131, 132, 133 and 134 are covered by an embedded insulation layer 106, as shown in FIG. 1 through FIG. 5. The embedded insulation layer 106 is composed of a resin, such as, for example, a polyimide resin. As shown in FIG. 1 through FIG. 3, the side surface of the second columnar section 132 and the side surface of the fourth columnar section 134 are in contact with each other. In other words, the second columnar section 132 and the fourth columnar section 134 are continuous. By this, the connection resistance between the first semiconductor layer 102 and the first semiconductor layer 112 can be reduced, and consequently the connection resistance between the emission section 140 and the rectification section 120 can be reduced. It is possible to make the second columnar section 132 and the fourth columnar section 134 not to be continuous. In other words, the embedded insulation layer 106 can be formed on the second face 101b of the substrate 101 between the second columnar section 132 and the fourth columnar section 134.

The emission section 140 and the rectification section 120 are electrically connected in parallel with each other, as shown in a circuit diagram of FIG. 6. The rectification section 120 has a rectification action in a reverse direction with respect to the emission section 140. As a concrete connection configuration, for example, the first electrode 107 and the third electrode 117 may be electrically connected with each other by a first wiring 126, and the second electrode 109 and the fourth electrode 119 may be electrically connected with each other by a second wiring 128. The first wiring 126 is in contact with an upper surface of the first electrode 107 and an upper surface of the third electrode 117. The second wiring 128 is in contact with an upper surface of the second electrode 109 and an upper surface of the fourth electrode 119. The first and second wirings 126 and 128 have a plane configuration that is, for example, a rectangular shape as shown in FIG. 1.

When the emission section 140 is driven, a voltage in a forward direction is impressed to the emission section 140, and a voltage in a reverse direction is impressed to the rectification section 120. In this instance, the breakdown voltage of the rectification section 120 may be preferably greater than the drive voltage of the emission section 140, so as to flow a current only in the emission section 140. By this, even when a voltage in a forward direction is impressed to the emission section 140, no (or almost no) reverse current flows in the rectification section 120, such that the emission operation normally takes place at the emission section 140.

It is noted that the invention is not limited to the case where the emission section 140 is a surface-emitting type semiconductor laser, but is also applicable to other surface-emitting type devices (such as, for example, semiconductor emission diodes).

Figure 7:
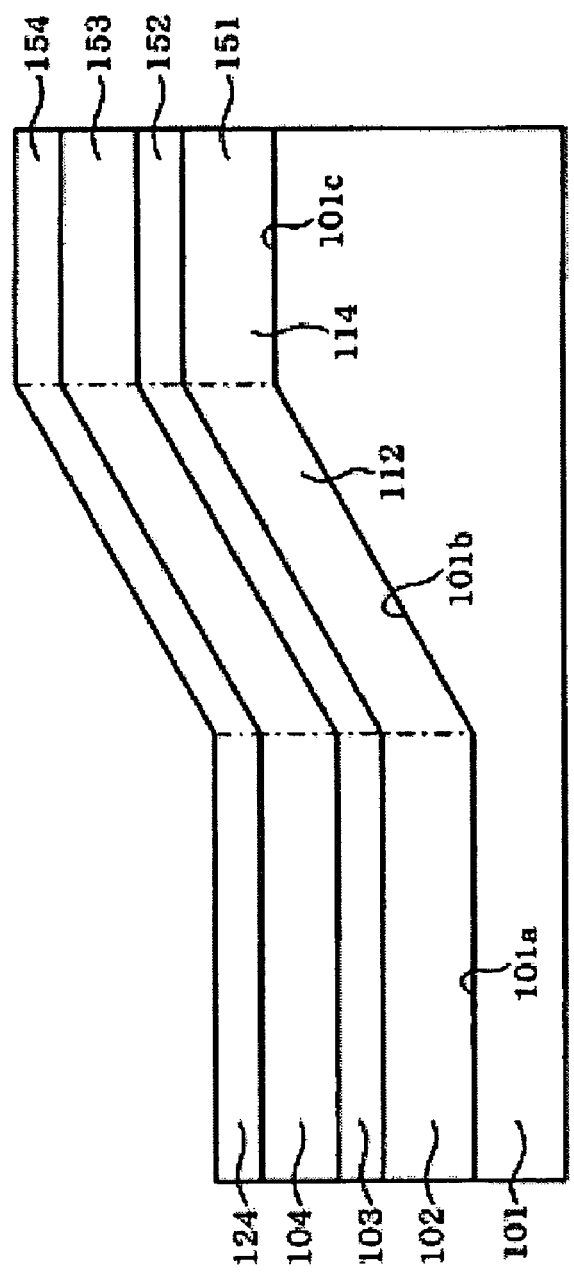
FIG. 7 is a cross-sectional view schematically showing a method for manufacturing a surface-emitting type device in accordance with an embodiment of the invention.
Figure 8:
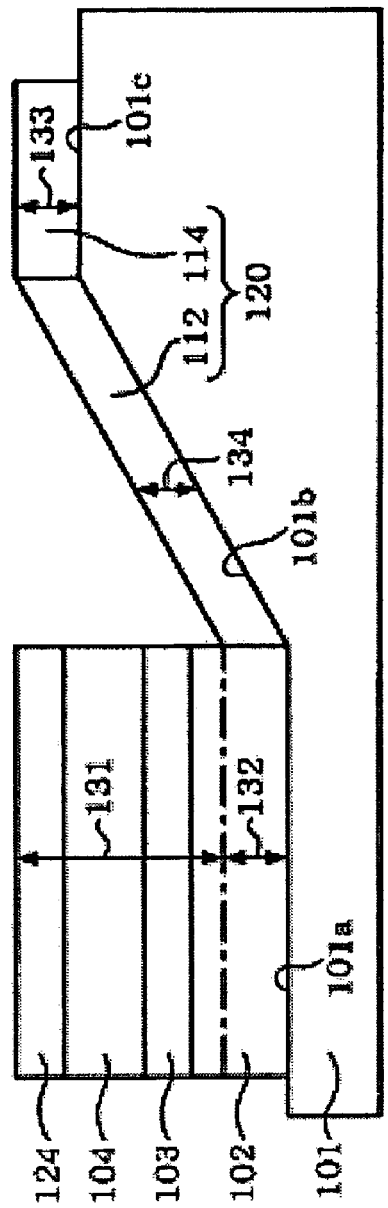
FIG. 8 is a cross-sectional view schematically showing the method for manufacturing a surface-emitting type device in accordance with the embodiment of the invention.
Figure 9:
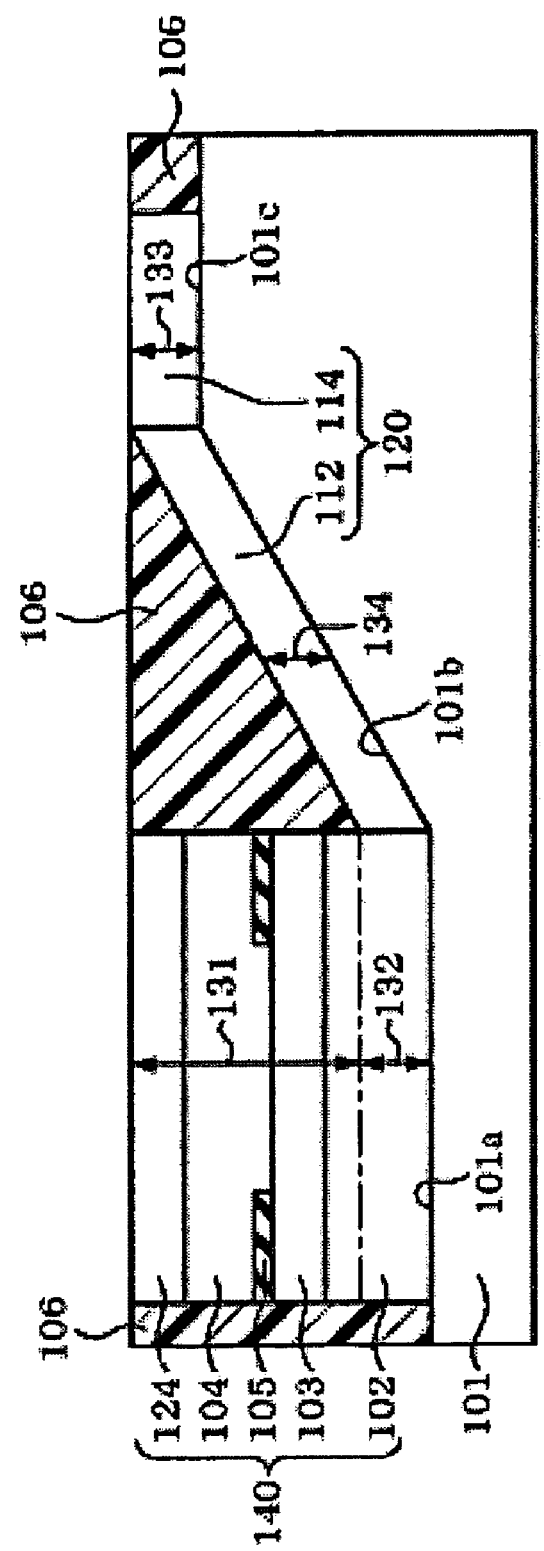
FIG. 9 is a cross-sectional view schematically showing the method for manufacturing a surface-emitting type device in accordance with the embodiment of the invention.

2. Next, an example of a method for manufacturing a surface-emitting type device 100 in accordance with an embodiment of the invention is described with reference to FIG. 1 through FIG. 5, and FIG. 7 through FIG. 9. FIG. 7 through FIG. 9 are cross-sectional views schematically showing the method for manufacturing a surface-emitting type device 100 shown in FIG. 1 through FIG. 5 in accordance with the present embodiment, and correspond to the cross-sectional view shown in FIG. 2, respectively.

(1) First, for example, a semi-insulating GaAs substrate is prepared as a substrate 101. Next, as shown in FIG. 7, first and third faces 101a and 101c, and a second face 101b are formed in an upper surface of the substrate 101. The first and third faces 101a and 101c, and the second face 101b are formed by using known lithography technique and etching technique, and etchant can be appropriately selected according to a combination of the plane index of the first and third faces 101a and 101c and the plane index of the second face 101b described above.

Next, as shown in FIG. 7, a first layer 151, a second layer 152, a third layer 153 and a fourth layer 154 are successively formed in this order on the substrate 101 by epitaxial growth while modifying their composition. The first layer 151 is a layer that becomes at least a first semiconductor layer 102 of the emission section 140, a first semiconductor layer 112 of the rectification section 120, and a second semiconductor layer 114 of the rectification section 120. The second layer 152 is a layer that becomes at least an active layer 103. The third layer 153 is a layer that becomes at least a second semiconductor layer 104 of the emission section 140. The fourth layer 154 is a layer that becomes at least a contact layer 124 of the emission section 140.

The first layer 151 is formed by using a molecular beam epitaxy (MBE) method. The first layer 151 (in other words, the first semiconductor layer 102 of the emission section 140, the first semiconductor layer 112 of the rectification section 120, and the second semiconductor layer 114 of the rectification section 120) may each include at least one of a GaAs layer and an AlGaAs layer. When the first layer 151 is formed, IV group atoms such as Si are added. IV group atoms such as Si atoms have the characteristic to become an n-type impurity or a p-type impurity within III-V group compound semiconductor such as GaAs depending on the plane index of the formed surface, and crystal growth condition (growth temperature, V/III atom ratio). Such characteristics are described in the aforementioned reference and other reference (such as Surface Science 267 (1992) 26 by M. Fujii et al.) Accordingly, by adjusting the crystal growth condition, IV group atoms such as Si atoms become to be an n-type (first conductivity type) impurity within the first layer 151 (i.e., the first semiconductor layer 102 of the emission section 140 and the second semiconductor layer 114 of the rectification section 120) that is formed on the first and third faces 101a and 101c. In other words, the first semiconductor layer 102 of the emission section 140 and the second semiconductor layer 114 of the rectification section 120 become to be an n-type. Also, by adjusting the crystal growth condition, IV group atoms such as Si atoms become to be a p-type (second conductivity type) impurity within the first layer 151 (i.e., the first semiconductor layer 112 of the rectification section 120) that is formed on the second face 101b. In other words, the first semiconductor layer 112 of the rectification section 120 becomes to be a p-type.

Also, the second layer 152 may be formed by using, for example, a MBE method, without doping an impurity (in other words, undoped), and the third and fourth layers 153 and 154 may be formed by using, for example, a MBE method, with a p-type impurity being doped. As the p-type impurity, for example, C, Be or the like can be used. The p-type impurity may preferably be doped during the crystal growth of the second layer 152, without using an ion injection method. By this, the process for manufacturing the surface-emitting type device 100 can be simplified.

It is noted that, when the third layer 153 is grown, at least one layer thereof near the active layer 103 may be formed to be a layer that is later oxidized and becomes an oxidized constricting layer 105 of the emission section 140. As the layer that becomes to be the oxidized constricting layer 105 of the emission section 140, an AlGaAs layer with its Al composition being 0.95 or greater can be used.

(2) Next, as shown in FIG. 8, the first through fourth layers 151, 152, 153 and 154 are patterned, to form first through fourth columnar sections 131, 132, 133 and 134 in desired configurations. In other words, the first semiconductor layer 102, the active layer 103, the second semiconductor layer 104 and the contact layer 124 of the emission section 140, and the first semiconductor layer 112 and the second semiconductor layer 114 of the rectification section 120 can be formed in desired configurations. The first through fourth layers 151, 152, 153 and 154 can be patterned by using known lithography technique and etching technique.

(3) Next, by placing the formed structure after the aforementioned steps in a water vapor atmosphere at about 400° C., for example, the above-described layer that becomes to be an oxidized constricting layer 105 of the emission section 140 is oxidized from its side surface, thereby forming the oxidized constricting layer 105 of the emission section 140, as shown in FIG. 9. When the emission section 140 having the oxidized constricting layer 105 is driven, electrical current flows only in a portion where the oxidized constricting layer 105 is not formed (a portion that is not oxidized). Accordingly, in the step for forming the oxidized constricting layer 105, the range of the oxidized constricting layer 105 to be formed may be controlled, whereby the current density can be controlled.

Next, as shown in FIG. 9, an embedded insulation layer 106 that surrounds the first through fourth columnar sections 131, 132, 133 and 134 is formed. For example, if a polyimide resin is used as the embedded insulation layer 106, first, a precursor layer (polyimide precursor layer) is formed by using, for example, a spin coat method or the like. After the substrate 101 is heated to thereby remove the solvent, the substrate 101 is placed in a furnace at about 350° C., to thereby imidize the precursor layer. By this, a polyimide resin layer that is almost completely cured can be formed. It is noted that an upper surface of the first columnar section 131 and an upper surface of the third columnar section 133 can be exposed by using, for example, known lithography technique and etching technique. By the aforementioned process, the embedded insulation layer 106 is formed.

(4) Next, as shown in FIG. 1 through FIG. 5, first through fourth electrodes 107, 109, 117 and 119 are formed, and then, first and second wirings 126 and 128 are formed. The electrodes and wirings may be formed by, for example, a combination of a vacuum vapor deposition method and a lift-off method, or the like. As the first and fourth electrodes 107 and 119 (n-type ohmic electrodes), for example, a laminated film of an alloy of gold (Au) and germanium (Ge), nickel (Ni) and gold (Au) laminated in this order can be used. As the second and third electrodes 109 and 117 (p-type ohmic electrodes), for example, a laminated film of an alloy of gold (Au) and zinc (Zn), and gold (Au) laminated in this order can be used. As the first and second wirings 126 and 128, for example, a laminated film of titanium (Ti), platinum (Pt) and gold (Au) laminated in this order can be used. It is noted that the materials of each of the electrodes and wirings are not limited to the above.

By the steps described above, the surface-emitting type device 100 in accordance with the present embodiment shown in FIG. 1 through FIG. 5 can be obtained.

3. According to the surface-emitting type device 100 in accordance with the present embodiment, even when a voltage in a reverse direction is impressed to the emission section 140, a current flows to the rectification section 120 that is connected in parallel with the emission section 140. By this, the electrostatic breakdown voltage of the surface-emitting type device 100 against a reverse direction voltage can be considerably improved. Accordingly, electrostatic destruction can be prevented in the mounting process or the like, such that its handling can be well facilitated, and its reliability can be improved.

Also, according to the present embodiment, in the step of patterning the first through fourth layers 151, 152, 153 and 154 (see FIG. 7 and FIG. 8), the upper surface of the emission section 140 (concretely, the upper surface of the contact layer 124 of the emission section 140) is not etched. In other words, the height of the emission section 140 (the film thickness of the emission section 140) does not change before and after the patterning step. This means that the control of the height of the emission section 140 does not depend on the accuracy of the etching. Accordingly, in accordance with the present embodiment, the emission section 140 can be formed as designed, and consequently, the surface-emitting type device 100 with excellent reliability can be provided.

Also, in accordance with the present embodiment, the upper surface of the emission section 140 is present on an extended plane of the upper surface of the second semiconductor layer 114 of the rectification section 120. By this, a step difference between the upper surface of the emission section 140 and the upper surface of the second semiconductor layer 114 of the rectification section 120 can be eliminated. As a result, the step difference in the second wiring 128 that connects the second electrode 109 formed on the upper surface of the emission section 140 and the fourth electrode 119 formed on the upper surface of the second semiconductor layer of the rectification section 120 can be made smaller. Accordingly, the disconnection of the second wiring 128 can be prevented. Also, influence on the patterning of the second wiring 128 which may be caused by the step difference in the second wiring 128 can be suppressed, such that the second wiring 128 can be accurately patterned.

Also, in the process of forming semiconductor layers in accordance with the present embodiment (see FIG. 7), only the first through fourth layers 151, 152, 153 and 154 are formed over the substrate 101. By this, for example, the processing time for manufacturing can be shortened, compared to the case where other layers are further formed over the fourth layer 154 for forming the rectification section 120 described above, and consequently, the manufacturing cost of the surface-emitting type device 100 can be reduced.

Also, according to the present embodiment, as shown in FIG. 6, the surface-emitting type device 100 is formed with two diodes, i.e., the diode at the emission section 140 and the diode at the rectification section 120. In other words, the surface-emitting type device 100 can be formed with diodes that are minimum necessity. Accordingly, by the present embodiment, the surface-emitting type device 100 with a simple structure can be provided.

Also, in accordance with the present embodiment, a part of the rectification section 120 (i.e., the first semiconductor layer 112 of the rectification section 120) is formed on the second face 101b that is tilted with respect to the first face 101a. By this, for example, the area where the rectification section 120 can be formed (in other words, the area of the second face 101b) can be increased without increasing the device area in a plan view, compared to, for example, the case where the rectification section 120 is formed on an extended plane of the first face 101a. Accordingly, the degree of freedom in design can be improved.

Also, in accordance with the present embodiment, the first semiconductor layer 102 of the emission section 140, the first semiconductor layer 112 of the rectification section 120, and the second semiconductor layer 114 of the rectification section 120 are formed by a common process. For example, the first semiconductor layer 102 of the emission section 140, the first semiconductor layer 112 of the rectification section 120, and the second semiconductor layer 114 of the rectification section 120 can be concurrently doped with an impurity. Accordingly, the manufacturing process can be simplified, when the emission section 140 and the rectification section 120 are formed on a common substrate.

Although the embodiments of the invention are described above in detail, it should be readily understood by a person having ordinary skill in the art that many modifications can be made without departing in substance from the novelty and effects of the invention. Accordingly, such modified examples should be included in the scope of the invention.

Figure 10:
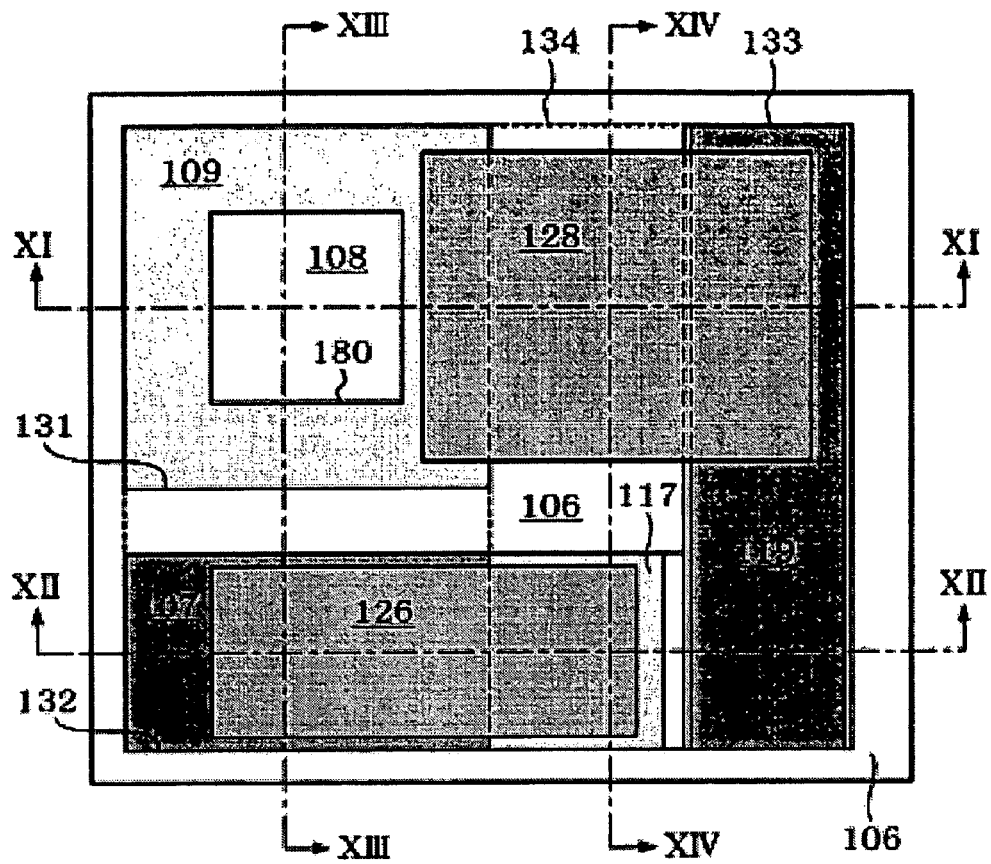
FIG. 10 is a plan view schematically showing a modified example of a surface-emitting type device in accordance with an embodiment of the invention.
Figure 11:
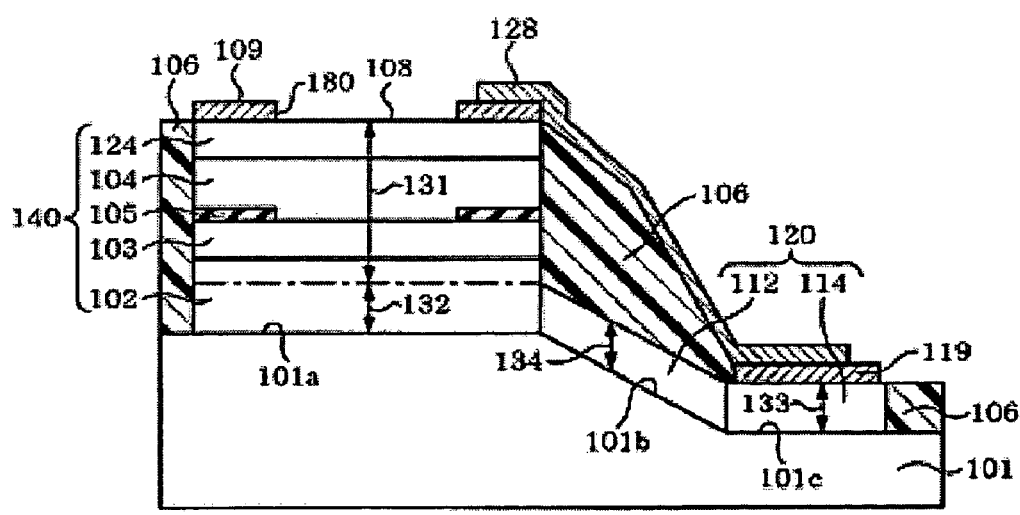
FIG. 11 is a cross-sectional view schematically showing the modified example of a surface-emitting type device in accordance with the embodiment of the invention.
Figure 12:
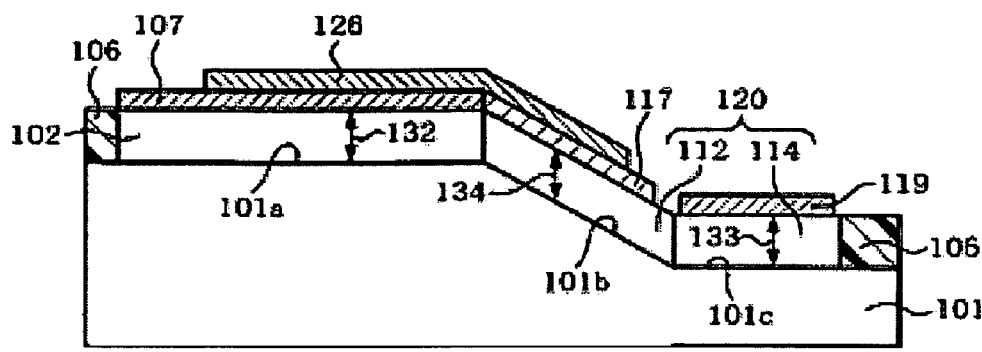
FIG. 12 is a cross-sectional view schematically showing the modified example of a surface-emitting type device in accordance with the embodiment of the invention.
Figure 13:
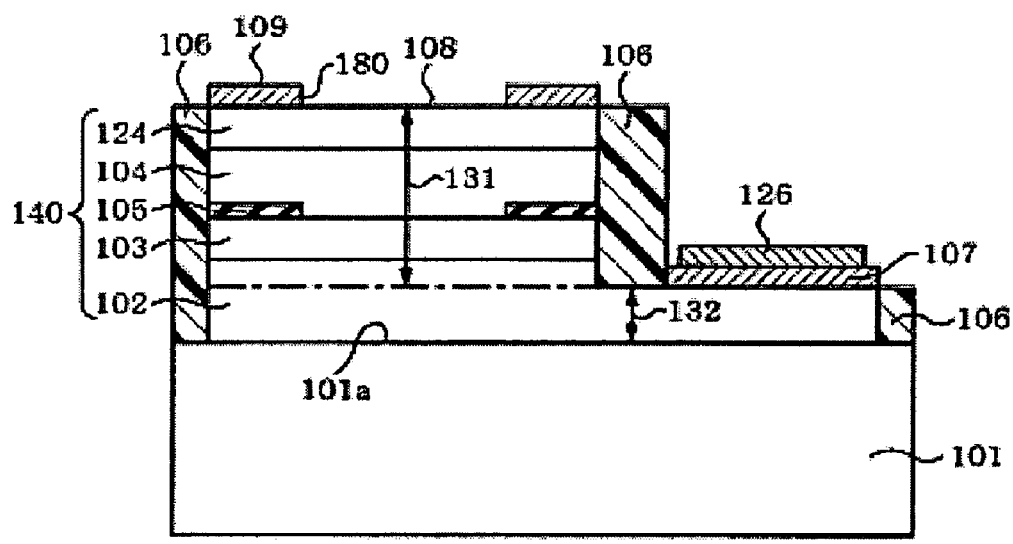
FIG. 13 is a cross-sectional view schematically showing the modified example of a surface-emitting type device in accordance with the embodiment of the invention.
Figure 14:
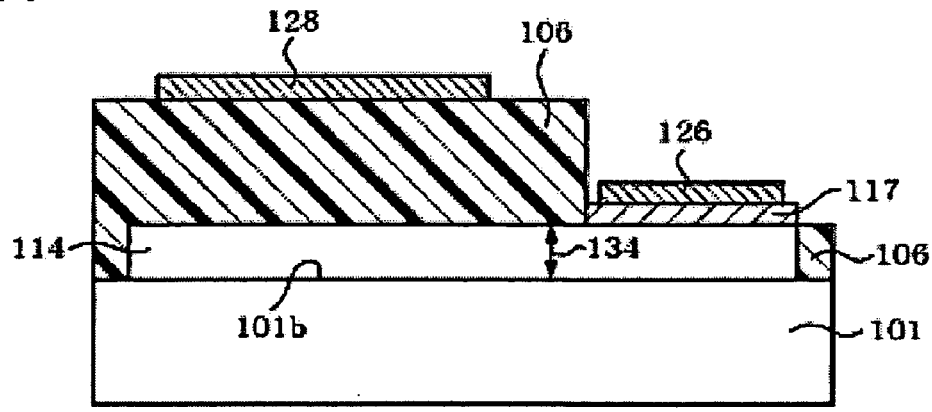
FIG. 14 is a cross-sectional view schematically showing the modified example of a surface-emitting type device in accordance with the embodiment of the invention.

For example as shown in FIG. 10 through FIG. 14, the first face 101a can be formed at a position higher than the third face 101c. It is noted that FIG. 10 is a plan view schematically showing a surface-emitting type device 100 in this case, FIG. 11 is a cross-sectional view taken along a line XI-XI of FIG. 10, FIG. 12 is a cross-sectional view taken along a line XII-XII of FIG. 10, FIG. 13 is a cross-sectional view taken along a line XIII-XIII of FIG. 10, and FIG. 14 is a cross-sectional view taken along a line XIV-XIV of FIG. 10.

For example, interchanging the p-type and n-type characteristics of each of the semiconductor layers in the above described embodiments does not deviate from the subject matter of the invention. In this case, the combinations of the plane index of the first and third faces 101a and 101c and the plane index of the second face 101b are appropriately selected such that the first semiconductor layer 102 of the emission section 140 and the second semiconductor layer 114 of the rectification section 120 become to be the second conductivity type (p-type), and the first semiconductor layer 112 of the rectification section 120 becomes to be the first conductivity type (n-type).

What is claimed is:
1. A surface-emitting type device comprising:
a substrate including a first face, a second face that is tilted with respect to the first face and has a plane index different from a plane index of the first face, and a third face that is tilted with respect to the second face and has a plane index equal to the plane index of the first face;
an emission section formed above the first face; and
a rectification section formed above each of the second face and the third face,
wherein the emission section includes a first semiconductor layer of a first conductivity type, an active layer formed above the first semiconductor layer, and a second semiconductor layer of a second conductivity type formed above the active layer,
the rectification section includes a first semiconductor layer of the second conductivity type formed above the second face, and a second semiconductor layer of the first conductivity type formed continuously with the first semiconductor layer above the third face,
at least a portion of the first semiconductor layer of the emission section, the first semiconductor layer of the rectification section, and the second semiconductor layer of the rectification section are formed by a common process and include the same impurity,
the emission section and the rectification section are electrically connected in parallel with each other, and
the rectification section has a rectification action in a reverse direction with respect to the emission section.
2. A surface-emitting type device according to claim 1, wherein
an upper surface of the first semiconductor layer of the emission section, an upper surface of the active layer of the emission section and an upper surface of the second semiconductor layer of the emission section are in parallel with the first face, an upper surface of the first semiconductor layer of the rectification section is in parallel with the second face, and an upper surface of the second semiconductor layer of the rectification section is in parallel with the third face.

3. A surface-emitting type device according to claim 1, wherein the first face and the third face have a plane index equal to a plane index of the substrate.

4. A surface-emitting type device according to claim 1, wherein the impurity is silicon, and the first semiconductor layer of the emission section, the first semiconductor layer of the rectification section and the second semiconductor layer of the rectification section include at least one of a GaAs layer and an AlGaAs layer.

5. A surface-emitting type device according to claim 1, comprising
a first electrode that is electrically connected to the first semiconductor layer of the emission section,
a second electrode that is electrically connected to the second semiconductor layer of the emission section,
a third electrode that is electrically connected to the first semiconductor layer of the rectification section, and
a fourth electrode that is electrically connected to the second semiconductor layer of the rectification section,
wherein the first electrode and the third electrode are electrically connected with each other, and the second electrode and the fourth electrode are electrically connected with each other.

6. A the surface-emitting type device according to claim 1, wherein an upper surface of the emission section is present on an extended plane of an upper surface of the second semiconductor layer of the rectification section.

7. A surface-emitting type device according to claim 1, wherein
the emission section functions as a surface-emitting type semiconductor laser, and
the first semiconductor layer of the emission section and the second semiconductor layer of the emission section are mirrors.

8. A surface-emitting type device comprising:
a substrate including a first face, a second face that is tilted with respect to the first face and has a plane index different from a plane index of the first face, and a third face that is tilted with respect to the second face and has a plane index equal to the plane index of the first face;
an emission section formed above the first face; and
a rectification section formed above each of the second face and the third face.

9. A surface-emitting type device according to claim 8, wherein
the emission section includes a first semiconductor layer of a first conductivity type, an active layer formed above the first semiconductor layer, and a second semiconductor layer of a second conductivity type formed above the active layer,
the rectification section includes a first semiconductor layer of the second conductivity type formed above the second face, and a second semiconductor layer of the first conductivity type formed continuously with the first semiconductor layer above the third face,
the emission section and the rectification section are electrically connected in parallel with each other, and
the rectification section has a rectification action in a reverse direction with respect to the emission section.

10. A surface-emitting type device according to claim 9, wherein
at least a portion of the first semiconductor layer of the emission section, the first semiconductor layer of the rectification section, and the second semiconductor layer of the rectification section are formed by a common process and include the same component of impurity.

* * * * *